(12) United States Patent
Nair et al.

(10) Patent No.: US 11,367,708 B2
(45) Date of Patent: Jun. 21, 2022

(54) MICROELECTRONIC DEVICES DESIGNED WITH EFFICIENT PARTITIONING OF HIGH FREQUENCY COMMUNICATION DEVICES INTEGRATED ON A PACKAGE FABRIC

(71) Applicant: Intel Corporation, Santa Clara, CA (US)

(72) Inventors: Vijay K. Nair, Mesa, AZ (US); Georgios C. Dogiamis, Chandler, AZ (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/714,502

(22) Filed: Dec. 13, 2019

(65) Prior Publication Data

US 2020/0219830 A1    Jul. 9, 2020

Related U.S. Application Data

(62) Division of application No. 15/777,040, filed as application No. PCT/US2015/000159 on Dec. 22, 2015, now Pat. No. 10,546,835.

(51) Int. Cl.
*H01L 25/065*     (2006.01)
*H01L 23/66*      (2006.01)
(Continued)

(52) U.S. Cl.
CPC ...... *H01L 25/0655* (2013.01); *H01L 23/5383* (2013.01); *H01L 23/5386* (2013.01);
(Continued)

(58) Field of Classification Search
CPC ............ H01L 25/0655; H01L 23/5383; H01L 23/5386; H01L 23/5389; H01L 23/552; H01L 23/645; H01L 24/20; H01L 25/065; H01L 24/16; H01L 25/105; H01L 23/66; H01L 2223/6672; H01L 2223/6677;
(Continued)

(56) References Cited

U.S. PATENT DOCUMENTS 7,351,660 B2    4/2008   Brewer
7,852,281 B2   12/2010   Choudhry
(Continued)

FOREIGN PATENT DOCUMENTS

WO     WO-03030254 A2 *    4/2003    ............. H01L 25/16

OTHER PUBLICATIONS

Office Action from Taiwan Patent Application No. 105137854, dated Feb. 6, 2020, 9 pgs.
(Continued)

*Primary Examiner* — Syed I Gheyas
(74) *Attorney, Agent, or Firm* — Schwabe, Williamson & Wyatt P.C.

(57) ABSTRACT

Embodiments of the invention include a microelectronic device that includes a transceiver coupled to a first substrate and a second substrate coupled to the first substrate. The second substrate includes an antenna unit for transmitting and receiving communications at a frequency of approximately 4 GHz or higher. An interposer substrate can provide a spacing between the first and second substrates.

15 Claims, 5 Drawing Sheets

(51) Int. Cl.
- *H01L 25/10* (2006.01)
- *H01L 23/538* (2006.01)
- *H01L 23/552* (2006.01)
- *H01L 23/64* (2006.01)
- *H01L 23/00* (2006.01)
- *H01Q 1/38* (2006.01)

(52) U.S. Cl.
CPC ........ *H01L 23/5389* (2013.01); *H01L 23/552* (2013.01); *H01L 23/645* (2013.01); *H01L 23/66* (2013.01); *H01L 24/16* (2013.01); *H01L 24/20* (2013.01); *H01L 25/065* (2013.01); *H01L 25/105* (2013.01); *H01Q 1/38* (2013.01); *H01L 2223/6672* (2013.01); *H01L 2223/6677* (2013.01); *H01L 2224/16225* (2013.01); *H01L 2224/214* (2013.01); *H01L 2924/3025* (2013.01); *H01L 2924/30111* (2013.01)

(58) Field of Classification Search
CPC ..... H01L 2224/214; H01L 2924/30111; H01L 2924/3025; H01L 2224/16225; H01Q 1/38
See application file for complete search history.

(56) References Cited

U.S. PATENT DOCUMENTS

| | | |
|---|---|---|
| 2003/0122079 A1 | 7/2003 | Pobanz |
| 2007/0229368 A1 | 10/2007 | Hata et al. |
| 2011/0140283 A1* | 6/2011 | Chandra ............. H01L 25/0652 257/777 |
| 2012/0119932 A1 | 5/2012 | MacDonald |
| 2013/0009320 A1 | 1/2013 | Yoo et al. |
| 2014/0110841 A1* | 4/2014 | Beer ................. H01L 23/49816 257/738 |
| 2014/0266902 A1 | 9/2014 | Kamgaing et al. |
| 2015/0295599 A1 | 10/2015 | Fujiwara et al. |

OTHER PUBLICATIONS

International Preliminary Report on Patentability for International Patent Application No. PCT/US2015/000159, dated Jul. 5, 2018, 11 pages.
International Search Report and Written Opinion for International Patent Application No. PCT/US2015/000159 dated Sep. 21, 2016, 2016, 14 pgs.
Notice of Allowance from Taiwan Patent Application No. 105137854, dated Aug. 6, 2020, 3 pgs.
Office Action from German Patent Application No. 112015007212.8, dated Aug. 31, 2020, 1 pgs.

* cited by examiner

US 11,367,708 B2

MICROELECTRONIC DEVICES DESIGNED WITH EFFICIENT PARTITIONING OF HIGH FREQUENCY COMMUNICATION DEVICES INTEGRATED ON A PACKAGE FABRIC

CROSS-REFERENCE TO RELATED APPLICATION

This patent application is a divisional of U.S. patent application Ser. No. 15/777,040, filed May 17, 2018, which is a U.S. National Phase Application under 35 U.S.C. § 371 of International Application No. PCT/US2015/000159, filed Dec. 22, 2015, entitled "MICROELECTRONIC DEVICES DESIGNED WITH EFFICIENT PARTITIONING OF HIGH FREQUENCY COMMUNICATION DEVICES INTEGRATED ON A PACKAGE FABRIC," which designates the United States of America, the entire disclosure of which are hereby incorporated by reference in their entirety and for all purposes.

FIELD OF THE INVENTION

Embodiments of the present invention relate generally to the manufacture of semiconductor devices. In particular, embodiments of the present invention relate to efficient partitions of microelectronic devices having high frequency communication devices integrated on a package fabric.

BACKGROUND OF THE INVENTION

Future wireless products are targeting operation frequencies much higher than the lower GHz range utilized presently. For instance 5G ($5^{th}$ generation mobile networks or $5^{th}$ generation wireless systems) communications is expected to operate at a frequency greater than or equal to 15 GHz. Moreover, the current WiGig (Wireless Gigabit Alliance) products operate at 60 GHz. Other applications including automotive radar and medical imaging, utilize wireless communication technologies in the millimeter wave frequencies (e.g., 30 GHz-300 GHz). For these wireless applications, the designed RF (radio frequency) circuits are in need of high quality matching passive networks, in order to accommodate the transmission of pre-defined frequency bands (where the communication takes place) as well as in need of high efficiency power amplifiers and low loss power combiners/switches.

DETAILED DESCRIPTION OF THE INVENTION

Figure 1:
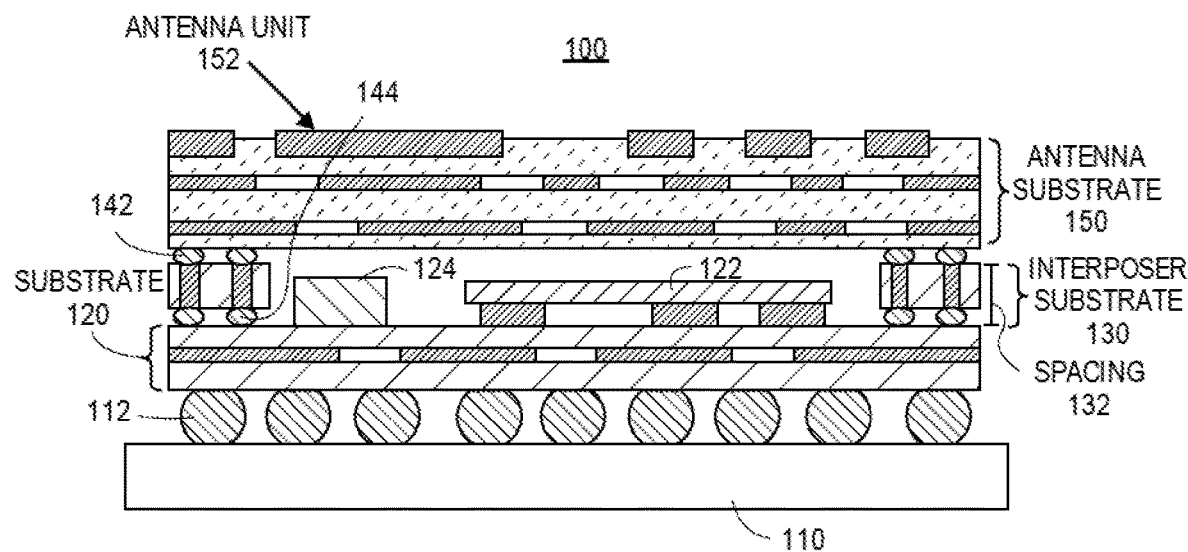
FIG. 1 illustrates co-integrating different components in a partitioned microelectronic device (e.g., a package fabric architecture) in accordance with one embodiment.

Described herein are microelectronic devices that are designed with efficient partitioning of high frequency communication devices in a package fabric. In the following description, various aspects of the illustrative implementations will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without the specific details. In other instances, well-known features are omitted or simplified in order to not obscure the illustrative implementations.

Various operations will be described as multiple discrete operations, in turn, in a manner that is most helpful in understanding embodiments of the present invention, however, the order of description should not be construed to imply that these operations are necessarily order dependent. In particular, these operations need not be performed in the order of presentation.

For high frequency (e.g., 5G, WiGig) wireless applications of millimeter (e.g., 1-10 mm, any mm wave) wave communication systems, the designed RF circuits (e.g., low-noise amplifiers, mixers, power amplifiers, etc.) are in need of high quality passive matching networks, in order to accommodate the transmission of pre-defined frequency bands where the communication takes place as well as in need of high efficiency power amplifiers, and low loss, power combiners/switches, etc. CMOS technology for greater than 15 GHz operation can be utilized, but with decreased power amplifier efficiencies and with low quality passives, mainly due to the typically lossy silicon substrate employed. This results not only in a lower system performance, but also in increased thermal requirements due to the excess heat generated. In one example, the high thermal dissipation is due to the fact that multiple power amplifiers have to be utilized in a phased array arrangement to achieve the desired output power and transmission range. This will be even more stringent on 5G systems as the typical transmission range for cellular network (e.g., 4G, LTE, LTE-Adv) is several times larger than that required for connectivity (e.g., WiFi, WiGig).

The present design efficiently partitions high frequency components (e.g., 5G transceiver) and utilizes non-CMOS technologies (e.g., non-silicon substrates) for critical parts of a communication system (e.g., GaAs, GaN, Passives-on-Glass, etc.). With an optimal system partitioning, critical parts requiring high efficiencies and high quality factors can be fabricated on another technology (e.g., compound semiconductor materials, group III-V materials). These parts might be either on device level (e.g., transistors on GaN/GaAs) or on circuit level (e.g., III-V die integrating a power amplifier, a low noise amplifier, etc.). The full communication system will be formed in a package-fabric manner, as discussed in embodiments of this invention.

The present design technology allows co-integrating dies and/or devices that are fabricated on different technologies and/or substrates on the same package for performance enhancement and relaxation of thermal requirements. The package might include antenna units for communication with other wireless systems.

In one embodiment, the present design is a 5G (5th generation mobile networks or 5th generation wireless systems) architecture having non-CMOS based transceiver building blocks (such as group III-V based devices or dies) that are co-integrated on the same package with low frequency circuits and integrated passive devices (IPDs) for performance enhancement and thermal requirements relaxation. In this arrangement, each component is assembled directly in the package. The package may have antennas directly integrated onto it. The 5G architecture operates at a high frequency (e.g., at least 20 GHz, at least 25 GHz, at least 28 GHz, at least 30 GHz, etc.) and may also have approximately 1-50 gigabits per second (Gbps) connections to end points. In another example, the present design operates at lower frequencies (e.g., at least 4 GHz, approximately 4 GHz).

In one example, the present design architecture includes a 5G transceiver system on chip partitioning scheme with interstate matching between partitioned circuits. This allows a system cost reduction, flexibility to optimize performance, and enables customization of a design for different types of products or design requirements (e.g., power level) for a product. The partitioning allows an easy integration of components with antenna units.

The design of this 5G architecture provides optimized performance for high frequency transceivers based on using compound semiconductor materials for certain components (e.g., switches, power amplifier, mixers) and integrated passive devices or dies (IPDs) for better quality passives. The present design also results in reduced cost due to having a first substrate designed for antenna or antenna components and a second substrate designed for higher frequency components. In one example, the functional testing of transceiver components, which may utilize in-mold-circuits, are decoupled from the need to assemble them initially on the package. Additionally, a wireless 5G module, which comprises RFIC with or without on-package antenna, can be designed and sold as a separate module. Functional blocks such as impedance matching circuits, harmonic filters, couplers, power combiner/divider, etc. can be implemented with IPDs. IPDs are generally fabricated using wafer fab technologies (e.g., thin film deposition, etch, photolithography processing).

Partitioning the 5G transceiver efficiently allows this architecture to reduce power consumption, decrease thermal requirements, and achieve higher power amplifier efficiencies (e.g., using group III-V technologies) with improve passives (e.g., utilizing IPDs and more efficient power combiners or switches) due to fabricating the passives on a non-CMOS substrate. The present architecture provides an ability to integrate all of these different discrete components on package together with the antenna to create a full 5G transceiver. These components can either be on a device level (e.g., discrete transistors) or on a circuit level (e.g., a power amplifier, a low noise amplifier).

FIG. 1 illustrates co-integrating different components in a partitioned microelectronic device (e.g., a package fabric architecture) in accordance with one embodiment. The partitioned microelectronic device 100 (e.g., a package fabric architecture 100) includes a printed circuit board (PCB) 110, a substrate 120, and an antenna substrate 150 having an antenna unit 152. The substrate 120 includes a transceiver 122 and a component 124 (e.g., integrated passive devices or dies (IPDs), a combiner, a switch, power amplifier, individual devices (e.g., transistors), any type of device or circuitry formed in compound semiconductor materials, etc). An interposer substrate 130 having a certain height (e.g., 50 to 500 microns) provides a spacing 132 between the substrate 120 and the antenna substrate 150. The interposer substrate provides electrical connections between components of the antenna substrate and components of the substrate 120. The interposer substrate 120 may also embed potential passives for the transceiver 122 (or other structures e.g. for shielding). In one example, the interposer can be formed with vias or pins. The antenna substrate can have a different thickness, length, and width dimensions in comparison to a thickness, length, and width dimensions of the substrate 120.

In one example, components of the antenna substrate which primarily dominate a packaging area are partitioned in a separate lower cost and lower circuit density substrate 150 in comparison to the substrate 120, which may have high density interconnect (HDI) and impedance controlled interconnect. An antenna substrate may be formed with low temperature co-fired ceramic materials, liquid crystal polymers, organic materials, glass, undoped silicon, etc. HDI PCB technologies may include blind and/or buried via processes and possibly microvias with a higher circuit density than traditional PCBs. In this manner, an area of the substrate 120 without antenna components is reduced to reduce cost in comparison to a planar structure that includes antenna components. The substrate 120 may be formed with any materials (e.g., organic materials, laminate substrates, materials for formation of CPUs, etc) that are designed for high frequency designs having desirable high frequency characteristics (e.g., substrate loss, dielectric constant).The transceiver 122 may include complementary metal-oxide-semiconductor (CMOS) circuitry (e.g., CMOS circuitry having at least one baseband unit and at least one transceiver unit formed with a silicon based substrate, CMOS die) or devices formed with compound semiconductor materials (e.g., group III-V materials, gallium arsenide (GaAs), gallium nitride (GaN), compound semiconductor die, etc.). The transceiver 122 may include a transceiver unit while a separate die that is mounted to the substrate 120 includes at least one baseband unit. The antenna unit 152 includes one or more conductive layers. The solder balls or bumps 142 couple the antenna substrate 150 to the interposer substrate 130 and the solder balls or bumps 144 coupled the interpose substrate to the substrate 120 while the solder balls or bumps 112 couple the PCB 110 to the substrate 120. In some embodiments connectors or pins may be used to connect electrically the lower substrate 120 to the PCB. Similarly metal to metal bumps may be used in place of solder bumps 142. In some embodiments, other discrete components or dies may be attached on the backside of substrate 120. Those components would be in the same plane, where the solder balls are illustrated in FIG. 1.

The interposer substrate 130 may be replaced with metal pillars or bumps with or without cavities if a smaller spacing (e.g., less than 100 microns) is needed between the antenna substrate 150 and the substrate 120.

Additional components such as traditional surface-mount passives may also be mounted to the substrate 120. In addition, the substrate 120 of FIG. 1 may be overmolded and covered with an external shield. The mold material may be a low loss nonconductive dielectric material and the shielding may be made out of a conductive material.

In another embodiment, any of the devices or components can be coupled to each other. For example, the component 124 can be coupled to at least one of the substrates 150, 130, and 120.

Figure 2:
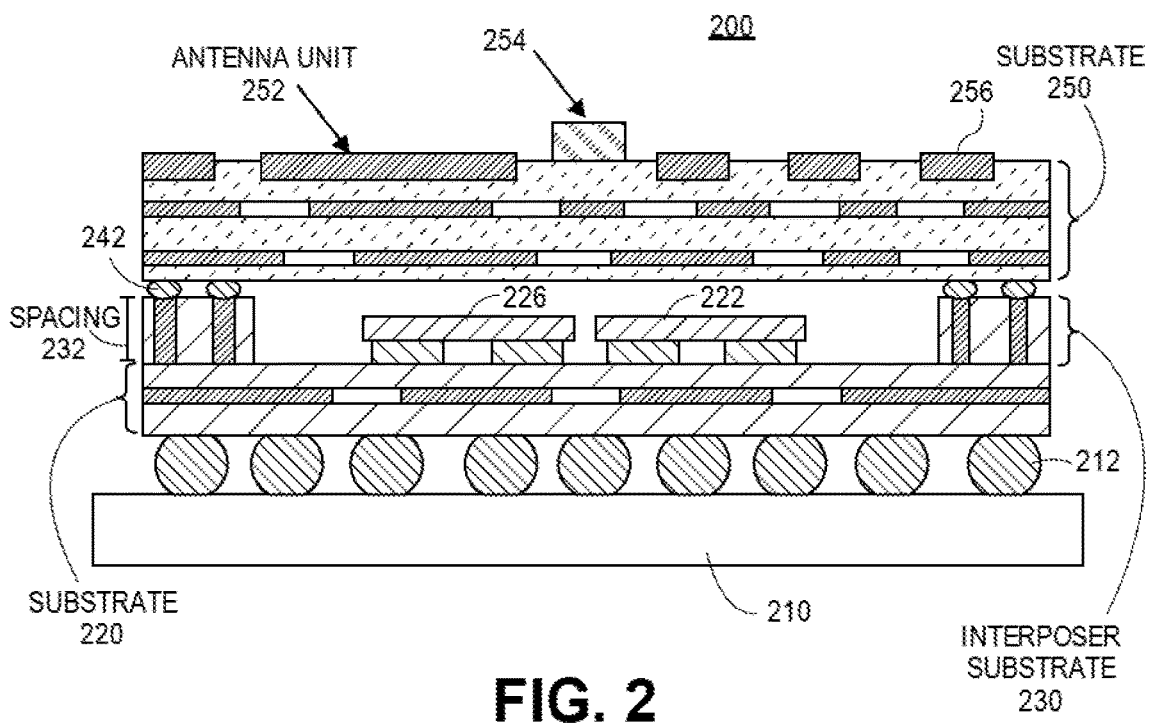
FIG. 2 illustrates co-integrating different components in a partitioned microelectronic device (e.g., a package fabric architecture) in accordance with another embodiment.

FIG. 2 illustrates co-integrating different components in a partitioned microelectronic device (e.g., a package fabric architecture) in accordance with another embodiment. The partitioned microelectronic device 200 (e.g., a package fabric architecture 200) includes a printed circuit board (PCB) 210, a substrate 220, and an antenna substrate 250 having an antenna unit 252. The substrate 220 includes a transceiver 222, a baseband unit 226, and optionally includes IPDs. An interposer substrate 230 having a certain height provides a spacing 232 between the substrate 220 and the antenna substrate 250. The interposer substrate provides electrical connections between components of the antenna substrate and components of the substrate 220. The interposer substrate 220 may also embed potential passives for the transceiver 222 (or other components such as a shield). In one example, the interposer can be formed with vias or pins. The antenna substrate 250 can have a different thickness, length, and width dimensions in comparison to a thickness, length, and width dimensions of the substrate 220. The antenna substrate 250 includes a component 254 (e.g., switches, switches formed in compound semiconductor materials, any type of device or circuitry, etc) and a component 256 (e.g., filters, combiners, etc). These components can also be formed or attached on a lower surface of the antenna substrate 250.

In one example, components of the antenna substrate which primarily dominate a packaging area are partitioned in a separate lower cost and lower circuit density substrate 250 in comparison to the substrate 220, which may have high density interconnect (HDI) and impedance controlled interconnect. An antenna substrate may be formed with low temperature ceramic materials, liquid crystal polymers, organic materials, glass, etc. The substrate 220 may be formed with any materials (e.g., organic materials, laminate substrates, materials for formation of CPUs, etc) that are designed for high frequency designs having desirable high frequency characteristics (e.g., substrate loss, dielectric constant). An area of the substrate 220 without antenna components is reduced to reduce cost in comparison to a planar structure that includes antenna components.

The transceiver 222 may include complementary metal-oxide-semiconductor (CMOS) circuitry (e.g., CMOS circuitry having at least one baseband unit and at least one transceiver unit formed with a silicon based substrate, CMOS die) or devices formed with compound semiconductor materials (e.g., group III-V materials, gallium arsenide (GaAs), gallium nitride (GaN), compound semiconductor die, etc.). The antenna unit 252 includes at least one antenna and one or more conductive layers. The solder balls or bumps 242 couple the antenna substrate 250 to the interposer substrate 230 while the solder balls or bumps 212 couple the PCB 210 to the substrate 220. The interposer substrate 230 may be replaced with metal pillars or bumps with or without cavities if a smaller spacing (e.g., less than 100 microns) is needed between the antenna substrate 250 and the substrate 220.

Figure 3:
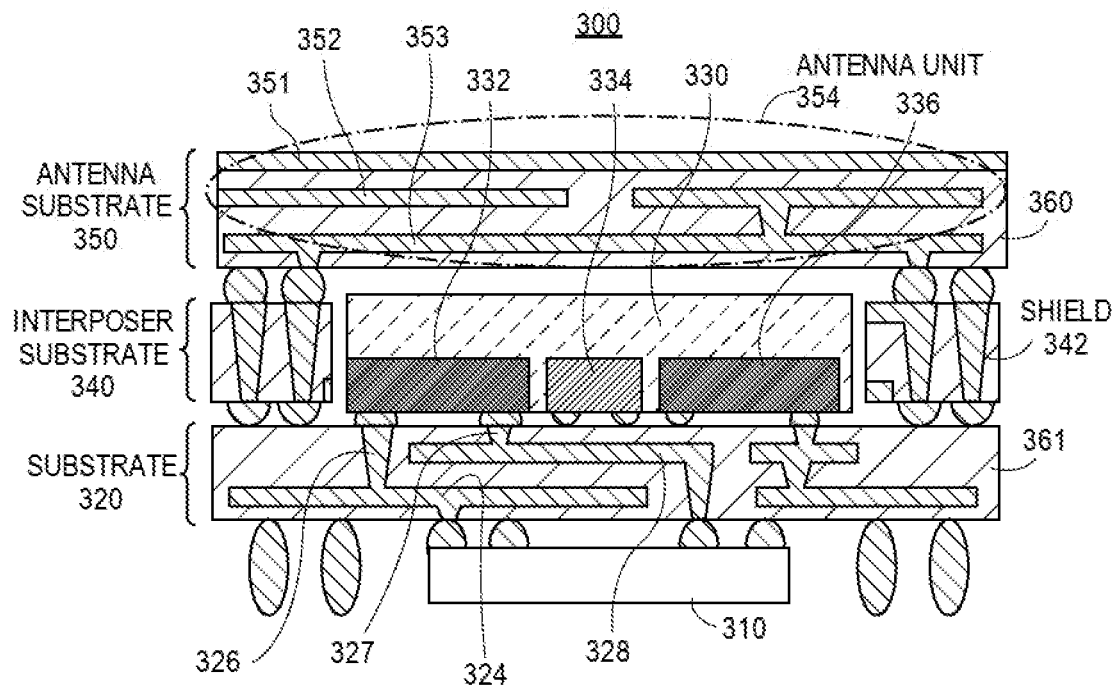
FIG. 3 illustrates co-integrating different components in a microelectronic device (e.g., a package fabric architecture) in accordance with another embodiment.

FIG. 3 illustrates co-integrating different components in a microelectronic device (e.g., a package fabric architecture) in accordance with another embodiment. The microelectronic device 300 (e.g., a package fabric architecture 300) includes CMOS circuitry of a die 310 (e.g., CMOS circuitry having at least one baseband unit and at least one transceiver unit formed with a silicon based substrate, CMOS die), circuitry of a die 332 having devices formed with compound semiconductor materials (e.g., group III-V materials, gallium arsenide (GaAs) or organic materials, gallium nitride (GaN), compound semiconductor die, etc.), circuitry or devices of a die 336 formed with compound semiconductor materials (e.g., group III-V materials, gallium arsenide (GaAs), gallium nitride (GaN), compound semiconductor die, etc.) or organic materials, IPD 330, and antenna unit 350 having at least one antenna for transmitting and receiving high frequency communications (e.g., 5G, WiGig, at least 4 GHz, at least 25 GHz, at least 28 GHz, at least 30 GHz). The antenna unit 350 includes conductive layers 351-353. In this example, the vias 326 and 327 and conductive layers 324 and 328 couple the circuitry 332 of a compound semiconductor die to the CMOS circuitry of the die 310 for electrical connections between these components. The substrates 320 and 350 include a plurality of dielectric layers 361 and 360, respectively, for isolation between conductive layers and components.

Compound semiconductor dies 332 and 336 (having circuitry or devices) along with IPD 334 are molded together in a separate overmolded component 330 (or overmolded module). If a total height of the overmolded component 330 is greater than a certain height (e.g., greater than 100 microns) then an interposer substrate 340 or pillars are needed for assembling the antenna substrate above the interposer substrate 340. If a total height of the overmolded component 300 less than a certain height (e.g., 100 microns) then bumps can be used instead of the interposer substrate. In one example, the interposer substrate 340 has a useful function of providing shielding of the RF dies of the overmolded component 330. Peripheral rows of shield 342 are inserted using grounded deep vias as illustrated in FIGS. 3 and 4.

Figure 4:
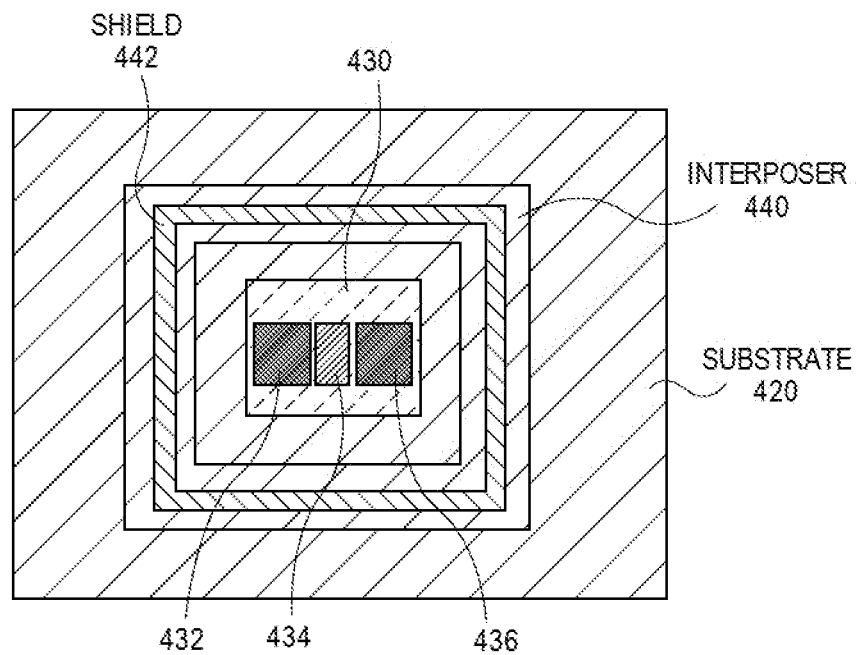
FIG. 4 illustrates a top view of an interposer substrate (e.g., interposer substrate 340, interposer substrate 440) and overmolded component (e.g., overmolded component 330, overmolded component 430) in accordance with one embodiment.

FIG. 4 illustrates a top view of an interposer substrate (e.g., interposer substrate 340, interposer substrate 440) and overmolded component (e.g., overmolded component 330, overmolded component 430) in accordance with one embodiment. This shield 442 in combination with a lower ground plane (e.g., conductive layer 353) of the antenna substrate 350 can form an effective Faraday shield of RF dies. The interposer 440 and shield 442 surround an overmolded component 430 that includes compound semiconductor dies 432 and 436 (or circuits of these dies) and IPD 434. Matching networks formed from passives, decoupling capacitors, power delivery networks, sensing circuits or switches can also be integrated in the overmolded component or on the substrate 320 (or embedded within substrate 320).

An in-mold circuit reduces cost due to being able to test the in-mold circuit separately from the rest of the substrate before assembly. The present design create an independent 5G module which can be manufactured and sold separately.

In one embodiment, the CMOS die 310 is flip-chipped on one side of the microelectronic device (e.g., a package fabric architecture). In one example, the CMOS die 310 on a first side (e.g., lower surface) of the microelectronic device has a thickness of approximately 25-75 um (e.g., approximately 50 um) while high power, high efficiency group III-V dies 332 and 336 are located on a second side (e.g., upper surface) of the microelectronic device (e.g., a package fabric architecture) embedded in overmolded component 330. In one example, compound semiconductor materials (e.g., GaN, GaAs, etc.) have significantly higher electron mobility in comparison to Silicon materials which allows faster operation. Compound semiconductor materials also have wider band gap, which allows operation of power devices at higher temperatures, and give lower thermal noise to low power devices at room temperature in comparison to Silicon materials. Compound semiconductor materials also have a direct band gap which provides more favorable optoelectronic properties than an indirect band gap of Silicon. Passives needed for passive matching networks are integrated in the IPD 334, or passive power combiners or splitters can be assembled on the microelectronic device (e.g., a package fabric architecture). The components may be approximately drawn to scale or may not be necessarily drawn to scale depending on a particular architecture. In one example, for a frequency of approximately 30 GHz, an antenna substrate 350 has dimensions of approximately 2.5 mm by 2.5 mm.

In one example, high frequency transceivers (e.g., 5G transceivers) utilize several transformers between two circuit components. In a partitioned system, a first circuit component might be on a different substrate than the other. Optimizing the connection between the two components, the present design can partition the transformer as well. This means that the primary and secondary windings of the transformer (XFM) will be located on at least 2 different substrates allowing the inductive coupling between the components without the need of a wired connection.

Figure 5:
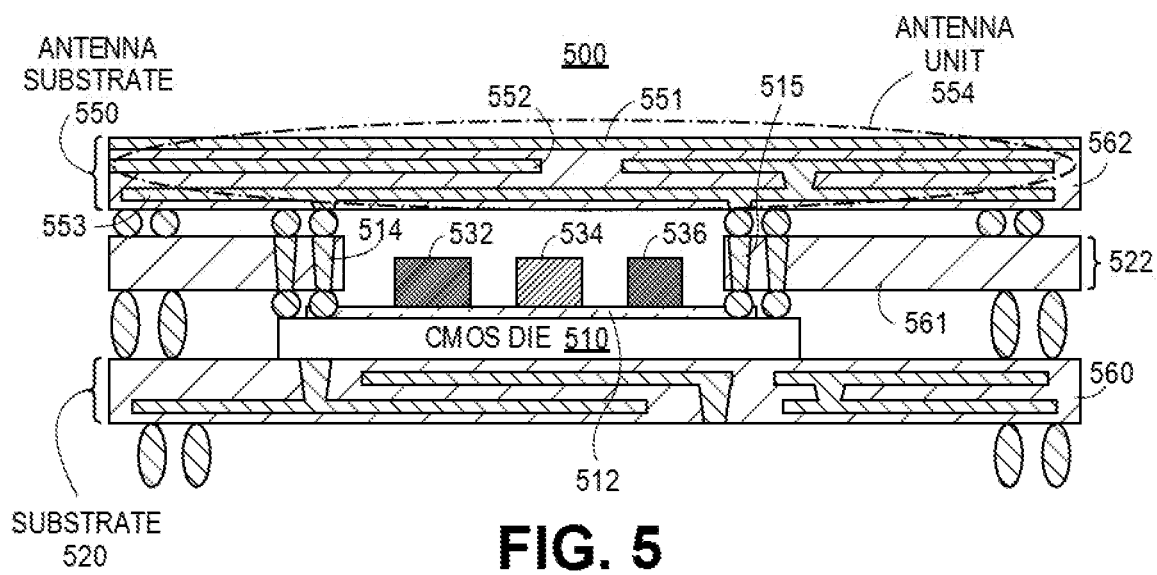
FIG. 5 illustrates co-integrating different components including a transformer in a microelectronic device (e.g., a package fabric architecture) in accordance with one embodiment.

FIG. 5 illustrates co-integrating different components including a transformer in a microelectronic device (e.g., a package fabric architecture) in accordance with one embodiment. The microelectronic device 500 (e.g., a package fabric architecture 500) includes CMOS circuitry of a die 510 (e.g., CMOS circuitry having at least one baseband unit and at least one transceiver unit formed with a silicon based substrate, CMOS die), circuitry or devices (e.g., individual transistors) of a die 532 formed with compound semiconductor materials (e.g., group III-V materials, gallium arsenide (GaAs), gallium nitride (GaN), compound semiconductor die, etc.) or organic materials, circuitry or devices of a die 536 formed with compound semiconductor materials (e.g., group III-V materials, gallium arsenide (GaAs), gallium nitride (GaN), compound semiconductor die, etc.) or organic materials, IPD 534, and an antenna substrate 550 having an antenna unit 554 with at least one antenna for transmitting and receiving high frequency communications (e.g., 5G, WiGig, at least 4 GHz, at least 25 GHz, at least 28 GHz, at least 30 GHz). The antenna unit 550 includes conductive layers 551-553. In this example, the vias 514 and 515 couple the antenna unit 554 to the CMOS circuitry 510 for electrical connections between these components. The substrates 520, 522, and 550 include a plurality of dielectric layers 560-562, respectively, for isolation between conductive layers and components. The circuits or devices of dies 532 and 536 and IPD 534 are directly coupled to the CMOS die 510 or coupled with a routing redistribution layer (RDL) 512.

Figure 6:
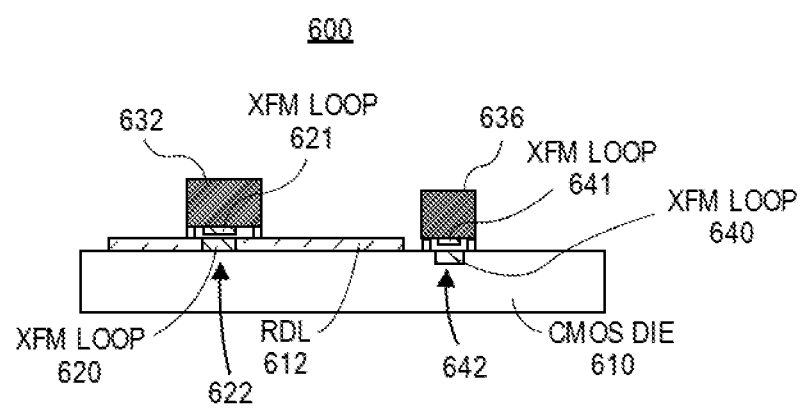
FIG. 6 illustrates an exploded view of partitioned transformers in accordance with one embodiment.

In one example, a transformer is partitioned between die 532 or die 536 and the CMOS die 510 with or without the routing layer 512. FIG. 6 illustrates an exploded view of partitioned transformers in accordance with one embodiment. A CMOS circuitry of a die 610 (e.g., CMOS circuitry formed with a silicon based substrate, CMOS die, die 510), circuitry or devices of a die 632 formed with compound semiconductor materials (e.g., group III-V materials, gallium arsenide (GaAs), gallium nitride (GaN), compound semiconductor die, die 532, etc.) or organic materials, circuitry or devices of a die 636 formed with compound semiconductor materials (e.g., group III-V materials, gallium arsenide (GaAs), gallium nitride (GaN), compound semiconductor die, die 536, etc.) or organic materials. In one example, the die 632 is coupled to the CMOS die 610 via a routing redistribution layer (RDL) 612. A transformer 622 includes a loop 621 and a loop 620. The loop 621 is located on a lower region or surface of the die 632 while the loop 620 is located within the routing layer 612 near an upper surface of the die 610. The loops 621 and 620 are separated by a small air gap or a thin dielectric layer in order to permit inductive coupling between these loops without needing a wired electrical connection.

In another example, a transformer 642 includes a loop 641 and a loop 640. The loop 641 is located on a lower region or surface of the die 636 while the loop 640 is located near an upper surface of the die 610 or embedded within the die. The loops 641 and 640 are separated by a small air gap or a thin dielectric layer in order to permit inductive coupling between these loops without needing a wired electrical connection.

In another example, a first loop of a transformer can be implemented directly on a package substrate and couple inductively to a second loop of the transformer which is integrated with an integrated circuit above the first loop.

Figure 7:
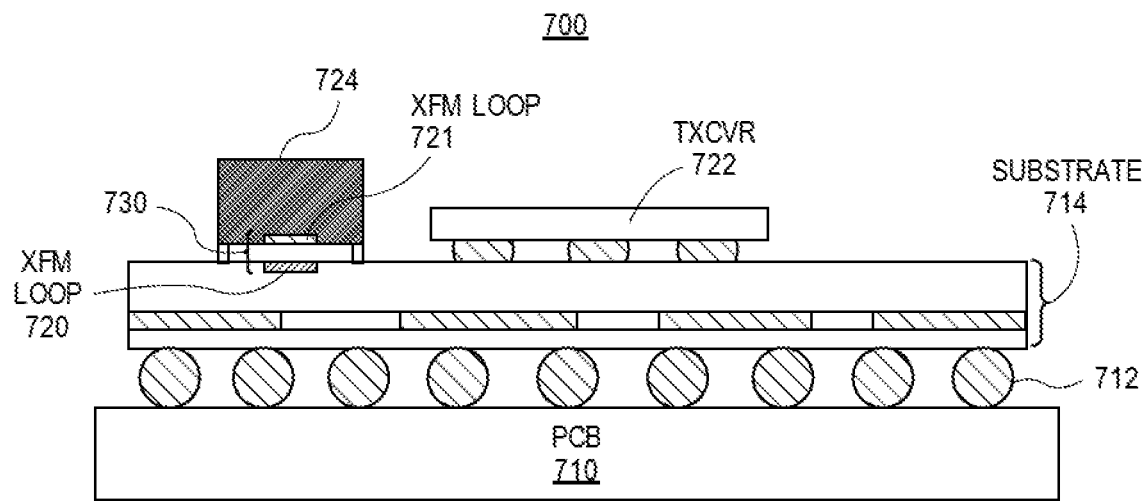
FIG. 7 illustrates a microelectronic device 700 with partitioned transformers in accordance with one embodiment.

FIG. 7 illustrates a microelectronic device 700 with partitioned transformers in accordance with one embodiment. The microelectronic device 700 (e.g., a package fabric architecture 700) includes a printed circuit board (PCB) 710 and a substrate 714 that includes a transceiver 722 and a component 724 (e.g., integrated passive devices or dies (IPDs), a combiner, a switch, power amplifier formed in compound semiconductor materials, etc). The component 724 is coupled to the substrate 714. A transformer 730 includes a loop 721 and a loop 720. The loop 721 is located on a lower region or surface of the component or die 724 while the loop 720 is attached or embedded within an upper surface of the substrate 714. The loops 721 and 720 are separated by a small air gap or a thin dielectric layer in order to permit inductive coupling between these loops without needing a wired electrical connection. In one example, the loops are separated by a distance of hundreds of nanometers to tens of microns. A larger distance reduces the inductive coupling between the loops.

Figure 8:
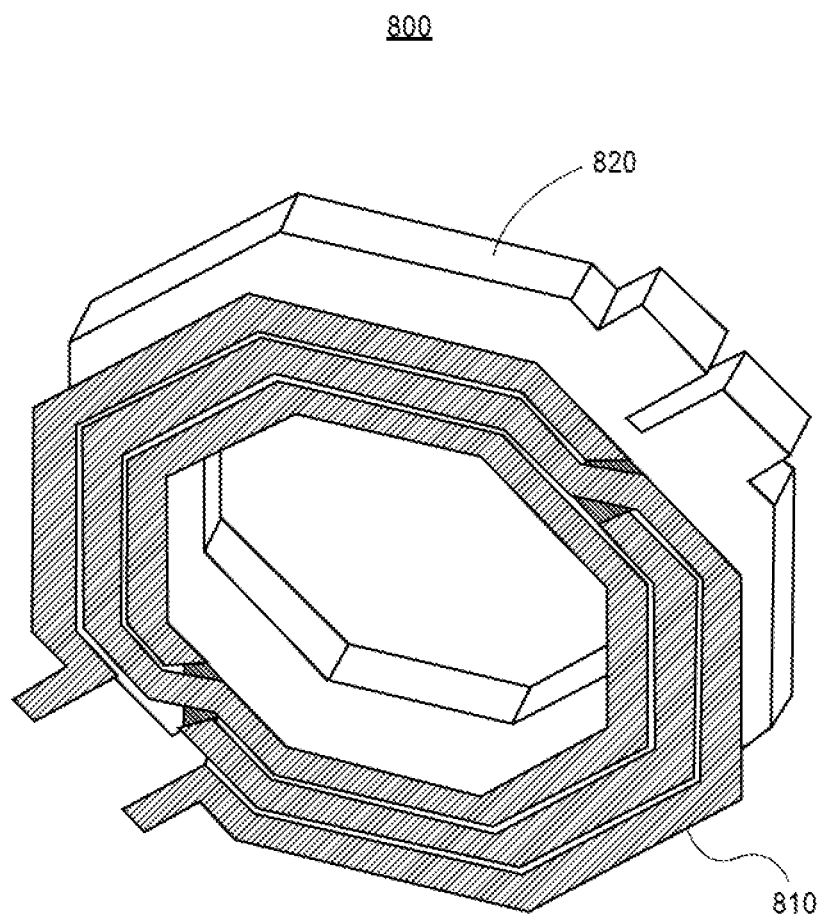
FIG. 8 illustrates a transformer having multiple loops in accordance with one embodiment.

FIG. 8 illustrates a transformer having multiple loops in accordance with one embodiment. A transformer is an electrical device that transfers electrical energy between two or more circuits through electromagnetic induction. A first loop 810 can be formed on a package or a die. The first loop 810 (e.g., lower loop) is illustrated with 3 loops but does not necessarily need to have multiple loops. A second loop 820 (e.g., upper loop) can be formed on a package or a die. The loop 820 (e.g., lower loop) is illustrated with a single loop but does not necessarily need to a single loop. Rather, the loop 820 can include multiple loops. An area (e.g., area on a package or on a die) consumed by a transformer, a distance between loops, a number of lower loops versus a number of upper loops, and thicknesses of the loops are design parameters that depend on a frequency of operation, a coupling coefficient between the loops, and design rules imposed by a fabrication technology. The loops can be formed in any manner (e.g., horizontally, vertically, etc.) on a package or die.

It will be appreciated that, in a system on a chip embodiment, the die may include a processor, memory, communications circuitry and the like. Though a single die is illustrated, there may be none, one or several dies included in the same region of the wafer.

In one embodiment, the microelectronic device may be a crystalline substrate formed using a bulk silicon or a silicon-on-insulator substructure. In other implementations, the microelectronics device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of embodiments of the present invention.

Figure 9:
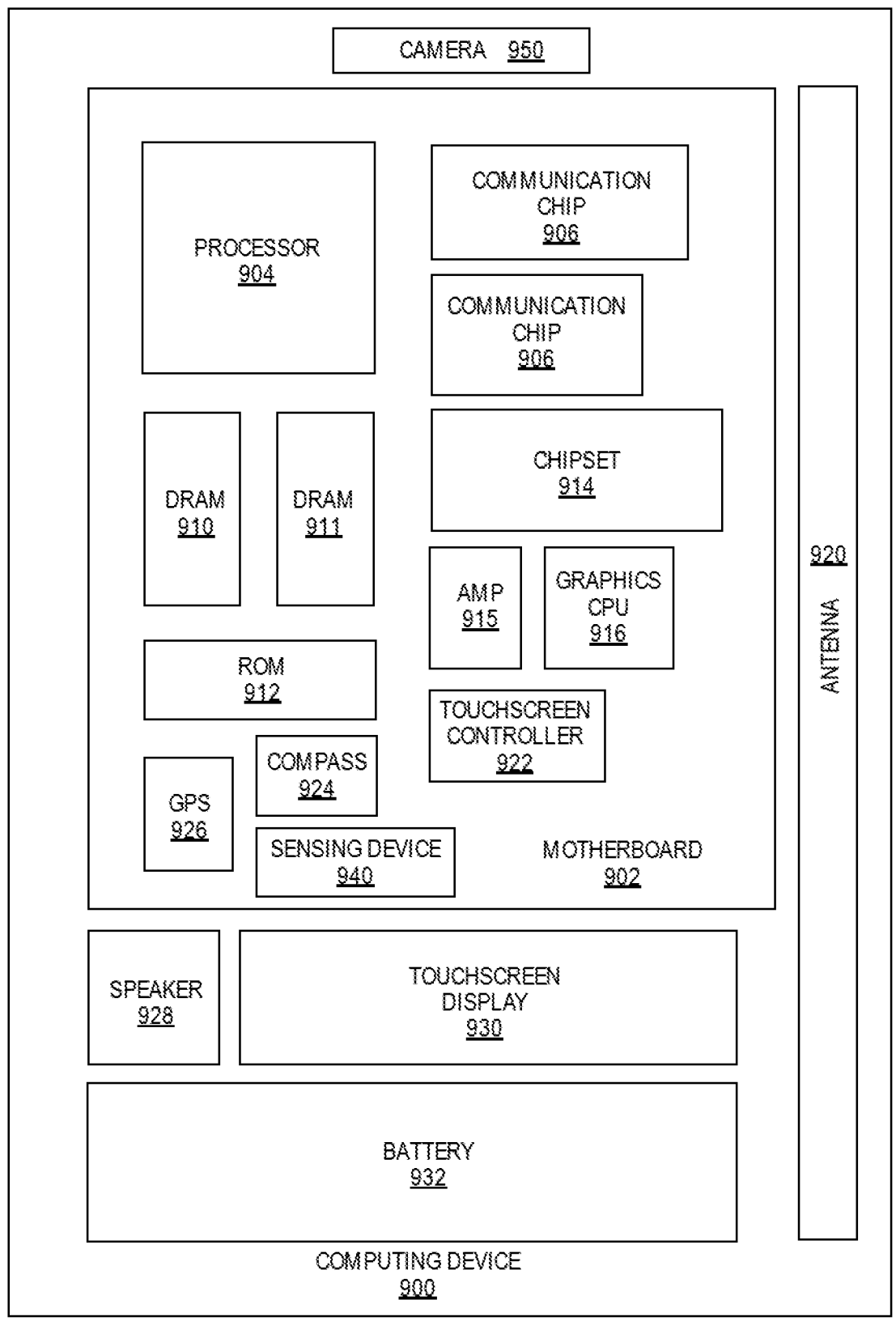
FIG. 9 illustrates a computing device 900 in accordance with one embodiment.

FIG. 9 illustrates a computing device 900 in accordance with one embodiment of the invention. The computing device 900 houses a board 902. The board 902 may include a number of components, including but not limited to at least one processor 904 and at least one communication chip 906. The at least one processor 904 is physically and electrically coupled to the board 902. In some implementations, the at least one communication chip 906 is also physically and electrically coupled to the board 902. In further implementations, the communication chip 906 is part of the processor 904. In one example, the communication chip 906 (e.g., microelectronic device 100, 200, 300, 400, 500, etc.) includes an antenna unit 920 (e.g., antenna unit 152, 252, 352, 554, etc.).

Depending on its applications, computing device 900 may include other components that may or may not be physically and electrically coupled to the board 902. These other components include, but are not limited to, volatile memory (e.g., DRAM 910, 911), non-volatile memory (e.g., ROM 912), flash memory, a graphics processor 916, a digital signal processor, a crypto processor, a chipset 914, an antenna unit 920, a display, a touchscreen display 930, a touchscreen controller 922, a battery 932, an audio codec, a video codec, a power amplifier 915, a global positioning system (GPS) device 926, a compass 924, a gyroscope, a speaker, a camera 950, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi, WiGig, and Bluetooth and a second communication chip 906 may be dedicated to longer range wireless communications such as GPS, EDGE, GPRS, CDMA, WiMAX, LTE, Ev-DO, 5G, and others.

The at least one processor 904 of the computing device 900 includes an integrated circuit die packaged within the at least one processor 904. In some implementations of embodiments of the invention, the integrated circuit die of the processor includes one or more devices, such as microelectronic devices (e.g., microelectronic device 100, 200, 300, 400, 500, etc.) in accordance with implementations of embodiments of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the invention, the integrated circuit die of the communication chip includes one or more microelectronic devices (e.g., microelectronic device 100, 200, 300, 400, 500, etc.).

The following examples pertain to further embodiments. Example 1 is a microelectronic device that includes a transceiver coupled to a first substrate and a second substrate coupled to the first substrate. The second substrate includes an antenna unit for transmitting and receiving communications at a frequency of approximately 4 GHz or higher (e.g., at least 4 GHz, at least 15 GHz, at least 25 GHz). In one example, the transceiver includes a transceiver unit and a baseband unit. In another example, the baseband unit is located in a separate substrate or die in comparison to the transceiver unit.

In example 2, the subject matter of example 1 can optionally include an integrated passive die (IPD) that is coupled to at least one of the first and second substrates. The IPD includes passives for passive matching networks.

In example 3, the subject matter of any of examples 1-2 can optionally include at least one radio frequency circuit (e.g., switch, low noise amplifier, power amplifier, etc.) formed with group III-V materials that is coupled to at least one of the first and second substrates.

In example 4, the subject matter of any of examples 1-3 can optionally include an interposer substrate to provide a spacing between the first and second substrates and to electrically couple the first and second substrates.

In example 5, the subject matter of example 4 can optionally include the interposer substrate that includes a shield for shielding RF signals of the transceiver.

In example 6, the subject matter of any of examples 1-5 can optionally include the second substrate that further includes at least one switch formed in compound semiconductor materials and a component that includes filters or combiner devices formed with compound semiconductor materials.

In example 7, the subject matter of any of examples 1-6 can optionally include the microelectronic device being a 5G package architecture for 5G communications.

Example 8 is a microelectronic device that includes a first die coupled to a first side of a first substrate and a second substrate coupled to a second side of the first substrate. The second substrate including an antenna unit for transmitting and receiving communications at a frequency of approximately 15 GHz or higher (e.g., at least 15 GHz, at least 25 GHz).

In example 9, the subject matter of example 8 can optionally include the microelectronic device that includes an overmolded component coupled to the second side of the first substrate. The overmolded component including an integrated passive die (IPD) coupled to the first substrate. The IPD includes passives for passive matching networks.

In example 10, the subject matter of any of examples 8-9 can optionally include the overmolded component having at least one die formed with group III-V materials that is coupled to the second side of the first substrate.

In example 11, the subject matter of any of examples 8-10 can optionally include the microelectronic device having an interposer substrate to provide a spacing between the first and second substrates and to electrically couple the first and second substrates.

In example 12, the subject matter of example 11 can optionally include the interposer substrate having a shield for shielding RF signals of devices of the overmolded component.

In example 13, the subject matter of any of examples 8-12 can optionally include the first die having complementary metal-oxide-semiconductor (CMOS) circuitry formed with a silicon based substrate.

In example 14, the subject matter of any of examples 8-13 can optionally include the microelectronic device being a 5G package architecture for 5G communications.

Example 15 is a computing device that includes at least one processor to process data and a communication module or chip that is coupled to the at least one processor. The communication module or chip includes a first substrate that supports a first die and a second die that is coupled to the first die. The second die may include devices formed with compound semiconductor materials. A second substrate is coupled to the first substrate. The second substrate includes an antenna unit for transmitting and receiving communications at a frequency of approximately 15 GHz or higher.

In example 16, the subject matter of example 15 can optionally include the computing device further including an integrated passive die (IPD) that is coupled to the first die. The IPD includes passives for passive matching networks.

In example 17, the subject matter of any of examples 15-16 can optionally include the first die having a complementary metal-oxide-semiconductor (CMOS) baseband circuitry.

In example 18, the subject matter of any of examples 15-17 can optionally include the computing device that further comprises a memory, a display module, and an input module. The memory, display module and input module being in operative communication on a chip chipset platform and each other.

Example 19 is a transformer that comprises a first loop located on a first die or substrate and a second loop located on a second die or substrate. The first and second loops are inductively coupled to each other. In another example, the first loop is located on a die and the second loop is located on a substrate or vice versa.

In example 20, the subject matter of example 19 can optionally include the second loop being formed in a routing layer that couples the first die or substrate to the second die or substrate.

In example 21, the subject matter of any of examples 19-20 can optionally include the first loop being embedded within the first die or substrate and the second loop being located on the second die or substrate.

In example 22, the subject matter of any of examples 19-21 can optionally include the second loop being embedded in the second die or substrate.

In example 23, the subject matter of any of examples 19-22 can optionally include the transformer that further comprises an air gap or dielectric material to separate the first loop from the second loop with no wiring connection between the first and second loops.

What is claimed is:

1. A computing device comprising:
   at least one processor to process data; and
   a communication module coupled to the at least one processor, wherein the communication module comprises,
   a first substrate that supports a first die, the first die electrically attached to the first substrate, wherein the substrate is an organic substrate separate and distinct from the first die;
   a second die coupled to the first die, the second die having devices formed with compound semiconductor materials, and the second die electrically attached to the first substrate; and
   a second substrate coupled to the first substrate by an interposer substrate, the second substrate having an antenna unit for transmitting and receiving communications at a frequency of approximately 15 GHz or higher, and the interposer substrate having a central opening extending entirely there through, wherein one or both or the first die or the second die is within the central opening and is laterally adjacent to the interposer substrate.

2. The computing device of claim 1 further comprising:
   an integrated passive die (IPD) coupled to the first die, the IPD includes passives for passive matching networks.

3. The computing device of claim 1, wherein the first die comprises a complementary metal-oxide-semiconductor (CMOS) baseband circuitry.

4. The computing device of claim 1, further comprising:
   a memory;
   a display module; and
   an input module, the memory, display module and input module being in operative communication on a chip chipset platform and each other.

5. The computing device of claim 1, wherein the first die is coupled to a first side of the first substrate, and the second die is coupled to the first side of the first substrate.

6. The computing device of claim 1, wherein the first die is coupled to a first side of the first substrate, and the second die is coupled to a second side of the first substrate, the second side opposite the first side.

7. The computing device of claim 1, wherein the second die is an overmolded die.

8. The computing device of claim 7, wherein the second die is between the first substrate and the second substrate.

9. The computing device of claim 1,
   wherein the interposer substrate is to provide a spacing between the first and second substrates and to electrically couple the first and second substrates.

10. The computing device of claim 9, wherein the interposer substrate comprises a shield for shielding RF signals.

11. The computing device of claim 10, wherein the shield includes a continuous metal layer completely encircling the second die.

12. The computing device of claim 1, further comprising:
    one or more additional dies coupled to the first die, wherein the second die and the one or more additional dies are overmolded together.

13. The computing device of claim 12, wherein the first die is coupled to a first side of the first substrate, and wherein the second die and the one or more additional dies are coupled to a second side of the first substrate, the second side opposite the first side.

14. The computing device of claim 13, further comprising:
 a plurality of solder bumps on the first side of the first substrate and laterally adjacent to the first die.

15. The computing device of claim 12, wherein the second die and the one or more additional dies are between the first substrate and the second substrate.

* * * * *